United States Patent
Park et al.

(10) Patent No.: US 9,711,780 B2
(45) Date of Patent: *Jul. 18, 2017

(54) BATTERY PACK CONTAINING PCM EMPLOYED WITH SAFETY MEMBER HAVING A PROTECTION CIRCUIT WITH A FUSING PART

(71) Applicant: LG CHEM, LTD., Seoul (KR)

(72) Inventors: Youngsun Park, Daejeon (KR); Jeongsuk Lee, Cheongju-si (KR); Keunpyo Ahn, Cheongju-si (KR); Chunyeon Kim, Chungcheongbuk-do (KR); Joung Ho Ha, Chungcheongbuk-do (KR); Masayuki Wakebe, Chungcheongbuk-do (KR)

(73) Assignee: LG CHEM, LTD., Seoul (KR)

( * ) Notice: Subject to any disclaimer, the term of this patent is extended or adjusted under 35 U.S.C. 154(b) by 147 days.

This patent is subject to a terminal disclaimer.

(21) Appl. No.: 14/535,897

(22) Filed: Nov. 7, 2014

(65) Prior Publication Data

US 2015/0064508 A1 Mar. 5, 2015

Related U.S. Application Data

(63) Continuation of application No. 13/759,694, filed on Feb. 5, 2013, now Pat. No. 9,373,833, which is a (Continued)

(30) Foreign Application Priority Data

Nov. 29, 2007 (KR) ........................ 10-2007-0122681
Nov. 29, 2007 (KR) ........................ 10-2007-0122711

(51) Int. Cl.
*H01M 14/00* (2006.01)
*H01M 2/34* (2006.01)
(Continued)

(52) U.S. Cl.
CPC .......... *H01M 2/34* (2013.01); *H01M 2/0404* (2013.01); *H01M 10/0525* (2013.01);
(Continued)

(58) Field of Classification Search
CPC .......... H01M 10/425; H01M 10/4257; H01M 10/5026; H01M 10/0525;
(Continued)

(56) References Cited

U.S. PATENT DOCUMENTS 8,697,264 B2 * 4/2014 Park .................... H01M 2/0404
429/149
2003/0157399 A1 8/2003 Ikeuchi et al.
(Continued)

FOREIGN PATENT DOCUMENTS

EP 1 102 338 A1 5/2001
JP 2001-195970 A 7/2001
(Continued)

*Primary Examiner* — Raymond Alejandro
(74) *Attorney, Agent, or Firm* — Birch, Stewart, Kolasch & Birch, LLP

(57) ABSTRACT

A battery pack including a battery cell having an electrode assembly of a cathode/separator/anode structure mounted in a battery case together with an electrolyte in a sealed state, and a protection circuit module (PCM) electrically connected to the battery cell. The PCM includes a protection circuit board (PCB) electrically connected to the battery cell, the PCB being provided on a region where a circuit is connected with a conductive pattern including a fusing part, having relatively high resistance, configured to fuse itself for interrupting the flow of current when a large amount of current is conducted.

9 Claims, 3 Drawing Sheets

Related U.S. Application Data continuation of application No. 12/745,500, filed as application No. PCT/KR2008/006980 on Nov. 27, 2008, now Pat. No. 8,697,264.

(51) Int. Cl.

| | | |
|---|---|---|
| *H01M 2/04* | (2006.01) |
| *H01M 10/0525* | (2010.01) |
| *H01M 10/42* | (2006.01) |
| *H05K 1/02* | (2006.01) |
| *H05K 3/22* | (2006.01) |
| *H05K 3/34* | (2006.01) |

(52) U.S. Cl.
CPC ..... *H01M 10/425* (2013.01); *H01M 10/4257* (2013.01); *H05K 1/0201* (2013.01); *H01M 2010/4271* (2013.01); *H01M 2200/00* (2013.01); *H01M 2200/103* (2013.01); *H01M 2200/106* (2013.01); *H01M 2220/30* (2013.01); *H05K 3/222* (2013.01); *H05K 3/341* (2013.01); *H05K 2201/10022* (2013.01); *H05K 2201/1028* (2013.01); *H05K 2201/10181* (2013.01); *Y02E 60/122* (2013.01)

(58) Field of Classification Search
CPC ... H01M 2010/4271; H01M 2010/425; H01M 2/34; H01M 2/1016; H01M 2/0404; H01M 2200/103; H01M 2200/106; Y02E 60/12; H05K 1/0201; H05K 3/341; H05K 2201/10181; H05K 2201/1028
See application file for complete search history.

(56) References Cited

U.S. PATENT DOCUMENTS

| | | | |
|---|---|---|---|
| 2004/0126656 A1 | 7/2004 | Cho | |
| 2005/0157450 A1* | 7/2005 | Liao | H01M 2/1061 361/620 |
| 2005/0208345 A1 | 9/2005 | Yoon et al. | |
| 2006/0269831 A1 | 11/2006 | Kim | |
| 2007/0057759 A1* | 3/2007 | Koyama | H01C 1/1406 338/22 R |
| 2007/0262745 A1 | 11/2007 | Lee et al. | |
| 2007/0264535 A1 | 11/2007 | Lee et al. | |
| 2008/0265326 A1* | 10/2008 | Hebert | H01L 23/3135 257/355 |
| 2013/0149564 A1* | 6/2013 | Park | H01M 2/0404 429/7 |

FOREIGN PATENT DOCUMENTS

| | | | |
|---|---|---|---|
| JP | 2004-165457 A | 6/2004 | |
| JP | 2005-277410 A | 10/2005 | |
| JP | 2006-147193 A | 6/2006 | |
| WO | WO 99/60637 A1 | 11/1999 | |
| WO | WO 2004/114331 | * 12/2004 | ............ H01C 7/02 |
| WO | WO 2004/114331 A1 | 12/2004 | |
| WO | WO 2009/066953 A2 | 5/2009 | |

\* cited by examiner

BATTERY PACK CONTAINING PCM EMPLOYED WITH SAFETY MEMBER HAVING A PROTECTION CIRCUIT WITH A FUSING PART

CROSS REFERENCE TO RELATED APPLICATIONS

This application is a Continuation of application Ser. No. 13/759,694, filed Feb. 5, 2013, now U.S. Pat. No. 9,373,833, which is a Continuation of application Ser. No. 12/745,500 filed on Nov. 1, 2010, now U.S. Pat. No. 8,697,264, which is the national phase of PCT International Application No. PCT/KR2008/006980 filed on Nov. 27, 2008, and which claims priority to Application Nos. 10-2007-0122681 and 10-2007-0122711 both of which were filed in the Republic of Korea on Nov. 29, 2007. The entire contents of all of the above applications are hereby incorporated by reference.

FIELD OF THE INVENTION

The present invention relates to a battery pack including a protection circuit module (PCM) equipped with a safety device, and, more particularly, to a battery pack including a battery cell having an electrode assembly of a cathode/separator/anode structure mounted in a battery case together with an electrolyte in a sealed state, and a protection circuit module (PCM) electrically connected to the battery cell, wherein the PCM is provided with a safety device of which a circuit is cut off when temperature is high or a large amount of current flows.

BACKGROUND OF THE INVENTION

As mobile devices have been increasingly developed, and the demand for such mobile devices has increased, the demand for secondary batteries has also sharply increased as an energy source for the mobile devices. Among them is a lithium secondary battery having high energy density and high discharge voltage, on which much research has been carried out and which is now commercially and widely used.

Based on the appearance thereof, the lithium secondary battery may be classified as a cylindrical battery, a prismatic battery, or a pouch-shaped battery. Based on the kind of an electrolyte used therein, the lithium secondary battery may be also classified as a lithium-ion battery or a lithium-ion polymer battery. A recent trend in the miniaturization of mobile devices has increased demand for the prismatic battery or the pouch-shaped battery, which have a small thickness.

However, various combustible materials are contained in the lithium secondary battery. As a result, there is a possibility of danger in that the lithium secondary battery will be heated or explode due to overcharge, overcurrent, or any other external physical impacts. In other words, the lithium secondary battery has low safety. Consequently, when the lithium secondary battery is exposed to high temperature, or when a large amount of current flows in the battery within a short time due to overdischarge, an external short circuit, a nail penetration, or a local crush, the battery is heated due to IR heat generation, with the result that the battery may catch fire or explode.

As the temperature of the battery increases, the reaction between an electrolyte and electrodes is accelerated. As a result, heat of reaction is generated, and therefore, the temperature of the battery further increases, which accelerates the reaction between the electrolyte and the electrodes. Consequently, the temperature of the battery sharply increases, and therefore, the reaction between the electrolyte and the electrodes is further accelerated. This vicious cycle causes a thermal runaway phenomenon in which the temperature of the battery sharply increases. When the temperature of the battery increases to a predetermined temperature level, the battery may catch fire. Also, as a result of the reaction between the electrolyte and the electrodes, gas is generated, and therefore, the internal pressure of the battery increases. When the internal pressure of the lithium secondary battery increases to a predetermined pressure level, the battery may explode. This possibility that the lithium secondary battery will catch fire or explode is the most fatal disadvantage of the battery.

Therefore, a point to be essentially considered in developing the lithium secondary battery is to secure the safety of the battery. Securing the safety of the battery may be achieved by a method of mounting a safety device outside a cell or a method of using a material contained in the cell. The use of a positive temperature coefficient (PTC) element and a circuit interruption device (CID) element using the change in temperature of the battery, a protection circuit for controlling voltage and current of the battery, and a safety vent using the change in internal pressure of the battery belongs to the former. The addition of a material that is changeable physically, chemically, and electrochemically depending upon the change in internal temperature or voltage of the battery belongs to the latter.

In the former case, a battery pack is constructed in a structure in which a PCM, serving to secondarily protect a battery and having an external input and output terminals connectable to an external device, is connected to a cathode terminal and an anode terminal via nickel plates, and a PTC element, serving to primarily protect the battery from overcurrent, overdischarge, and overcharge of the battery cell, is connected to the electrode terminals. The nickel plates are attached to the top and bottom of the PTC element. The nickel plate attached to the top of the PTC element is electrically connected to the PCM, and the nickel plate attached to the bottom of the PTC element is electrically connected to the electrode terminals of the battery cell.

In order to assemble the battery pack with the above-stated construction, however, several welding processes are required to achieve the electrical connection between the PTC element and the PCM and between the PTC element and the electrode terminals. Furthermore, when welding is performed in a state in which the PTC element and the nickel plates are not in position, a short circuit may occur, or connection regions may separate from each other during the assembly or the use of the battery pack. Also, since the PTC element is connected to the PCM and the battery cell, it is required for the nickel plates to have a large length. The long nickel plates must be bent such that the PCM is loaded on the battery cell, with the result that a dead space corresponding to the bent space is formed, and therefore, the volume density of the battery pack relatively decreases. Furthermore, stress is generated at the time of bending the nickel plates, with the result that the nickel plates or the PTC may crack.

In the latter case, a method of adding an additive for improving safety to the electrolyte or the electrodes may be used as a method of using a material contained in the cell. A chemical safety device has an advantage in that the chemical safety device does not require an additional process and space, and is applicable to all kinds of batteries. However, the chemical safety device has a problem in that the performance of the battery may deteriorate due to the addition of the material. Such material has been reported to include a material to form immovable film at the electrodes and a material to increase the resistance of the electrodes through the increase in volume thereof when temperature increases. However, when the immovable film is formed, a by-product is also formed, with the result that the performance of the battery may deteriorate. Also, the volume of the material occupying the interior of the battery increases, with the result that the capacity of the battery decreases. Consequently, secure safety is not guaranteed when adding the material, and therefore, it is not possible to use a method of adding the material as an independent measure.

SUMMARY OF THE INVENTION

Therefore, the present invention has been made to solve the above problems, and other technical problems that have yet to be resolved.

As a result of a variety of extensive and intensive studies and experiments to solve the problems as described above, the inventors of the present application have found that, when a protection circuit module (PCM) is provided with a safety device of which a circuit is cut off when temperature is high or a large amount of current flows, it is possible to efficiently utilize the internal space of a battery and to efficiently secure the safety of the battery by easy electrical connection of the safety device. The present invention has been completed based on these findings.

In accordance with one aspect of the present invention, the above and other objects can be accomplished by the provision of a battery pack including a battery cell having an electrode assembly of a cathode/separator/anode structure mounted in a battery case together with an electrolyte in a sealed state, and a protection circuit module (PCM) electrically connected to the battery cell, wherein the PCM is provided with a safety device of which a circuit is cut off when temperature is high or a large amount of current flows.

Since the battery pack according to the present invention is constructed in a structure in which the safety device is provided at the PCM, as described above, it is possible to minimize the waste of the internal space of the battery pack, to increase the volume density of the battery pack, and to simplify the battery pack assembling process.

In a concrete embodiment, the battery pack further includes a positive temperature coefficient (PTC) element loaded on the PCM for interrupting current when temperature is high, and the PTC has a top directly attached to the PCM without an additional connection member such that the PTC is electrically connected to the PCM and a bottom electrically connected to a predetermined circuit via a connection member attached to the bottom thereof.

Since the PTC element is electrically connected to the battery cell and a circuit related to the operation of the battery pack, i.e., an operation circuit of the PCM, by the connection member attached to the bottom of the PTC element, while the top of the PTC element is electrically connected to the PCM, it is possible for current to pass through the PTC element such that the current flows between an external input and output terminal and the battery cell.

In the battery pack with the above-stated construction, the top of the PTC element is directly attached to the PCM without an additional connection member, such as a nickel plate. Consequently, it is possible to fundamentally prevent the occurrence of a short circuit or the separation between connection regions, which may occur during the assembling process when the connection is achieved by welding using the nickel plate. Also, it is possible to reduce the internal space occupied by the connection member during the connection between the PCM and the PTC element and to maximally utilize such a newly available space, thereby increasing the volume density of the battery cell as compared with other battery cells having the same standard.

As previously defined, the PTC element is electrically connected to a predetermined circuit by the connection member attached to the bottom thereof. The predetermined circuit electrically connected to the connection member may be a battery cell.

In the above-described structure, the connection member is connected to a corresponding electrode terminal of the battery cell for interrupting the flow of current between the battery cell and the PCM when temperature is high. That is, the PTC element may be directly connected to the battery cell by the connection member.

The connection between the connection member and the electrode terminal may be achieved, for example, in a structure in which, in a battery pack including a battery case embodied by a metal container, a protruding terminal is formed at the middle of the top of the battery cell such that the protruding terminal is insulated from the metal container, and the connection member of the PTC element is connected to the protruding terminal.

Also, the predetermined circuit electrically connected to the connection member may be an operation circuit of the PCM.

That is, the connection member is connected to a circuit ('operation circuit'), requiring the electrical connection, of the PCM, for performing charge and discharge operations of the battery pack. As a result, current flows via the PTC element, thereby achieving normal charge and discharge of the battery pack. Consequently, the PTC element interrupts the flow of current in the PCM circuit when temperature is high, and therefore, it is possible to achieve the disconnection between the battery cell and the external input and output terminal.

Meanwhile, the top of the PTC element is directly attached to the PCM without an additional connection member such that the PTC element is electrically connected to the PCM. In this case, the PTC element is preferably attached to a gold coating part formed on a board of the PCM, i.e., a printed circuit board (PCB), to easily achieve the coupling and electrical connection between the PTC element and the PCB.

The connection between the top of the PTC element and the PCM and/or the connection between the PTC element and the connection member may be achieved by various methods, such as bonding, welding, and soldering. Preferably, the connection between the top of the PTC element and the PCM and/or the connection between the PTC element and the connection member is achieved by soldering.

The material for the connection member is not particularly restricted as long as the connection member exhibits variable conductivity. Also, the shape of the connection member is not particularly restricted. Preferably, the connection member is formed of a nickel plate.

In an exemplary example, the connection member may include an overcurrent interruption part having a horizontal sectional area equivalent to 10 to 90% of an average horizontal sectional area of the entire connection member. In this case, the sectional area of a portion of the connection member is less than that of the remaining portion of the connection member.

As previously described, the PTC element is electrically connected to the battery cell and the operation circuit on the PCB, which is connected to the battery cell, by the connection member attached to the bottom of the PTC element. The overcurrent interruption part is included in the connection member having the above-stated construction. Consequently, it is possible for the connection member to automatically cut itself off, when overcurrent is generated, thereby interrupting the flow of current. In particular, the overcurrent interruption part operates in response to the change of current, not the change in physical shape of the battery, and therefore, the overcurrent interruption part exhibits a rapid response speed.

Consequently, the PTC element having the connection member with the above-stated construction serves to not only interrupt the flow of current when the temperature of the battery is abnormally high but also interrupt the flow of current when overcurrent is generated, thereby reducing the number of parts constituting other safety devices and improving process efficiency.

The overcurrent interruption part has resistance negligible in a normal operation state of the battery. However, in an abnormal operation state of the battery, e.g., when overcurrent is conducted due to an external short circuit in which overcurrent of several tens of amperes (A) flows, the overcurrent interruption part automatically cuts itself off, while a relatively large amount of heat is generated from the overcurrent interruption part, to prevent the electrical conduction in the battery. That is, the overcurrent interruption part serves as a kind of safety device. This principle will be described below in detail.

Generally, a relationship among resistance, current, and the amount of heat generated is represented by Equation 1 below.

$$W = I^2 \times R \qquad (1)$$

Where, W indicates the amount of heat generated, I indicates current, and R indicates resistance.

Also, resistance is in inverse proportion to sectional area as represented by Equation 2 below.

$$R \propto 1/A \qquad (2)$$

Where, R indicates resistance, and A indicates sectional area.

In the connection member including a part having a horizontal sectional area equivalent to 10 to 90% of an average horizontal sectional area of the entire connection member, the amount of heat generated from the part having the small sectional area abruptly increases, as represented by Equation 1 above, when overcurrent is generated. Consequently, it is possible for the overcurrent interruption part to be easily cut itself off due to the large amount of heat generated, thereby securing not only the stability of the battery in a high temperature condition but also the stability of the battery in an overcurrent condition due to the abnormal operation of the battery.

The shape of the overcurrent interruption part is not particularly restricted as long as the overcurrent interruption part satisfies the above-mentioned conditions. For example, the overcurrent interruption part may be configured in a structure in which a width of the connection member is reduced, a structure in which a thickness of the connection member is reduced, or a structure in which a middle of the connection member is drilled. According to circumstances, the overcurrent interruption part may be configured in a combination of the above-specified structures.

The structure in which the width of the connection member is reduced may be provided by forming various shaped depressions at one or both sides of the connection member. The depressions may be formed in a round shape, in a notch shape, or in a square shape. However, the depressions are not limited to the above-specified shapes. The structure in which the middle of the connection member is drilled may be provided by forming various shaped through-holes at the middle of the connection member. The through-holes may be formed in the shape of a circle, an ellipse, a rectangle, or a triangle. However, the through-holes are not limited to the above-specified shapes. The overcurrent interruption part may be formed in various manners based on the shape thereof. For example, the overcurrent interruption part may be formed by forging, rolling, or punching.

In another concrete example, on the other hand, the PCM may include a protection circuit board (PCB) electrically connected to the battery cell, and the PCB may be provided on a region where a circuit is connected with a conductive pattern including a fusing part, having relatively high resistance, configured to fuse itself for interrupting the flow of current when a large amount of current is conducted.

That is, the conductive pattern configured to interrupt overcurrent is printed on the PCB such as the conductive pattern circuitry embodied, with the result that the battery pack does not require a space necessary to mount an additional safety device having specific volume. Consequently, it is possible to minimize the waste of the internal space of the battery pack, to increase the volume density of the battery pack, and to simplify the battery pack assembling process. Also, the fusing part quickly fuses itself in response to the change of current, when a large amount of current is conducted, to immediately interrupt the flow of the current, thereby securing the safety of the battery pack with high operating reliability.

In the above-described structure, the amount of heat generated from the fusing part, when a large amount of current flows, abruptly increases with the increase of resistance as represented by Equation 1 above. Consequently, the amount of heat generated increases with the increase in resistance of the fusing part, and therefore, the fusing part easily fuses itself when a large amount of current is conducted. As a result, it is possible to rapidly interrupt the flow of current before the safety of the battery reaches a critical level by the conduction of a large amount of current. In consideration of this fact, the fusing part may be configured to have a high resistance value.

In an exemplary example, the fusing part may be configured to have low current density. To this end, it is possible to consider a method of reducing the sectional area of the conductive pattern. In connection with this matter, it is very difficult to adjust the height of the conductive pattern. For this reason, it is preferred to change the width of the conductive pattern. Consequently, the fusing part may be configured in a structure having a width less than the overall width of the conductive pattern.

That is, when overcurrent is generated, the amount of heat generated from the conductive pattern abruptly increases as represented by Equation 1 above. Such increase is doubled at the fusing part, which is a small-width part. Consequently, it is possible for the fusing part to easily fuse itself by the large amount of heat generated from the fusing part, thereby securing the stability of the battery in an overcurrent condition due to the abnormal operation of the battery.

However, when the width of the fusing part is too small, output loss of the fusing part in a normal operation state inefficiently increases due to high resistance of the fusing part, and the fusing part may easily fuse itself even by a relatively small amount of heat generated from the fusing part, which leads to the lowering of the operation reliability. On the other hand, when the width of the fusing part is too large, it is difficult for the fusing part to automatically fuse itself, when overcurrent is generated, with the result that it is difficult to achieve a desired effect. In consideration of this fact, the fusing part may have a width equivalent to 10 to 90%, preferably 30 to 80%, of the average width of the conductive pattern.

The structure in which the width of the fusing part is reduced may be provided by forming various shaped depressions at one or both sides of the fusing part. The depressions may be formed in the same shape as the depressions previously described. Also, the number of the fusing parts is not particularly restricted. For example, two or more fusing parts may be formed as needed.

The conductive pattern may be a part of a protection circuit pattern printed on the PCB. Also, the conductive pattern may be made of gold (Au) exhibiting electrical conductivity enough to be generally used in the protection circuit pattern.

In an exemplary example, the conductive pattern may be formed of a metal material exhibiting specific resistance higher than that of the protection circuit pattern printed on the PCB. Alternatively, only the fusing part may be formed of a metal material exhibiting high specific resistance.

Here, the metal material exhibiting high specific resistance is a concept including a metal material exhibiting specific resistance greater than that of a metal material constituting the protection circuit pattern on the PCB or a metal material constituting the remaining region of the conductive pattern, not only metal having an absolute value of specific resistance. The metal material exhibiting high specific resistance has electrical conductivity enough not to interfere with the electrical conduction in a normal operation state of the battery. In an exemplary example, the metal material exhibiting high specific resistance may be, but is not limited to, tin (Sn) or a tin alloy.

A method of forming the conductive pattern is not particularly restricted. For example, the conductive pattern may be formed by a well-known pattern forming method, such as photolithography.

The structure of the battery pack is not particularly restricted as long as the battery pack includes the battery cell and the PCB. Consequently, various well-known structures may be applied to the structure of the battery pack without particular limitations. The battery cell may be used in a cylindrical battery, a prismatic battery, and a pouch-shaped battery. Various safety devices may be loaded on the PCB to constitute the PCM. The PCM 150 may include a field effect transistor (FET), as a switching element for controlling the conduction of current, and passive elements such as a voltage detector, a resistor, and a condenser.

In an exemplary structure of the battery pack according to the present invention, the PCM is provided with a safety device, the battery cell has an electrode assembly mounted in a metal container together with an electrolyte, the metal container has an open top sealed by a top cap, and the battery pack further includes an insulative mounting member constructed in a structure in which the PCM is loaded at a top of the insulative mounting member, the insulative mounting member being mounted to the top cap of the battery cell and an insulative cap coupled to an upper end of the battery cell for covering the insulative mounting member in a state in which the PCM is loaded on the insulative mounting member. Also, the top cap is provided with a pair of protrusion-type electrode terminals (a first protrusion-type electrode terminal and a second protrusion-type electrode terminal) connected to a cathode and an anode of the electrode assembly, respectively, the insulative mounting member is provided with through-holes corresponding to the protrusion-type electrode terminals, the PCM is provided with through-holes corresponding to the protrusion-type electrode terminals, and the coupling of the insulative mounting member and the PCM to the battery cell is achieved by successively fixedly inserting the protrusion-type electrode terminals through the through-holes of the insulative mounting member and the PCM.

In the battery pack with the above-stated construction, the coupling between the components constituting the battery pack is achieved by successively fixedly inserting the protrusion-type electrode terminals through the through-holes of the insulative mounting member and the PCM.

At this time, the electrical connection between the connection member and the protrusion-type electrode terminals may be achieved by welding. Alternatively, the electrical connection between the connection member and the protrusion-type electrode terminals may be achieved by simply inserting the connection member between the protrusion-type electrode terminals and the protection circuit module, which will be described hereinafter in detail with reference to the accompanying drawings.

The battery pack with the above-stated construction has the effect of achieving the assembly in a simple coupling fashion, achieving easy mechanical coupling, simplifying a manufacturing process, and achieving a coupling structure very stable against external impact or vibration.

Ends of the protrusion-type electrode terminals may protrude from a top of the protection circuit module by a predetermined length, and the protruding ends of the protrusion-type electrode terminals may be pressed to be fixed to the protection circuit module. Specifically, the coupling and electrical connection of the insulative mounting member and the PCM to the battery cell and the electrical connection between the protection circuit module and the electrode terminals are simultaneously achieved by a series of simple processes including forming a pair of protrusion-type electrode terminals at the top cap such that the protrusion-type electrode terminals are connected to the cathode and the anode of the electrode assembly, respectively, successively inserting the protrusion-type electrode terminals through the corresponding through-holes of the insulative mounting member and the PCM, and pressing ends of the electrode terminals protruding from the top of the PCM.

The protrusion-type electrode terminals may be configured, for example, in a conductive rivet structure. The shape of the protrusion-type electrode terminals is not particularly restricted as long as the protrusion-type electrode terminals are easily inserted through the through-holes of the protection circuit module and the insulative mounting member. For example, the protrusion-type electrode terminals may be formed in the plan shape of a circle, an ellipse, or a rectangle. The pressing of the ends of the protrusion-type electrode terminals further increases the strength of the coupling of the insulative mounting member and the PCM to the battery cell.

Also, the material for the protrusion-type electrode terminals is not particularly restricted as long as the protrusion-type electrode terminals are made of a highly conductive material. Preferably, the protrusion-type electrode terminals are made of a steel coated with copper (Cu), nickel (Ni), and/or chrome (Cr), stainless steel, aluminum (Al), an Al alloy, an Ni alloy, a Cu alloy, or a Cr alloy. When the protrusion-type electrode terminals are integrally formed with the top cap, it is natural that the protrusion-type electrode terminals are made of the same material as the top cap.

Meanwhile, the protrusion-type electrode terminals may serve to not only fixedly couple the protection circuit module and the insulative mounting member to the top of the battery cell but also make it easy to manufacture the battery cell and simplify the structure of the battery cell.

For example, at least one of the protrusion-type electrode terminals may be configured in a hollow structure including a through-channel communicating with the interior of the battery case. The through-channel may be used as an electrolyte injection port, through which an electrolyte is injected, after the electrode assembly is mounted in the battery case, during the manufacture of the battery cell. That is, at least one of the protrusion-type electrode terminals may be used as the electrolyte injection port, and therefore, there is no need to form an additional electrolyte injection port at the top cap unlike conventional battery cells. Consequently, the through-channel may be sealed, for example, by a metal ball after being used as the electrolyte injection port.

The protrusion-type electrode terminals are variously applicable irrespective of the kind and external shape of battery cells. For a prismatic battery cell, for example, the first protrusion-type electrode terminal may be connected to the cathode of the battery cell while being electrically connected to the top cap, and the second protrusion-type electrode terminal may be connected to the anode of the battery cell while being electrically isolated from the top cap. Consequently, it is possible for the first protrusion-type electrode terminal to serve as a cathode terminal and for the second protrusion-type electrode terminal to serve as an anode terminal.

In the above-described structure, the first protrusion-type electrode terminal may be integrally formed with the top cap. That is, the first protrusion-type electrode terminal may be formed simultaneously when pressing the top cap. Of course, however, the protrusion-type electrode terminal may be separately prepared, and then the protrusion-type electrode terminal may be coupled to the top cap. For example, the protrusion-type electrode terminal may be coupled to the top cap by welding. In consideration of productivity, however, it is more preferable to form the protrusion-type electrode terminal using the former method, i.e., to form the protrusion-type electrode terminal simultaneously when pressing the top cap.

In another example, the top cap may be provided with a through-hole, the second protrusion-type electrode terminal may include a plate-shaped main body, an upper extension extending upward from the main body such that the upper extension is perpendicular from the main body, and a lower extension extending downward from the main body such that the lower extension is perpendicular from the main body, the lower extension being configured to be inserted through the through-hole of the top cap, and the second protrusion-type electrode terminal may be coupled to the top cap by pressing the end of the lower extension of the second protrusion-type electrode terminal in a state in which the lower extension of each protrusion-type electrode terminal is inserted through the through-hole of the top cap.

In the coupling structure between the top cap and the protrusion-type electrode terminals as described above, it is possible for the electrode terminals to be more easily and stably coupled to the top cap. Also, the upper extension and the lower extension of each protrusion-type electrode terminal more securely and stably maintain the coupling of the protection circuit module and the insulative mounting member to the battery cell.

Meanwhile, the insulative mounting member may be coupled to the battery cell, preferably by a bonding method using an adhesive, such that the insulative mounting member is stably mounted to the top cap, thereby increasing the strength of the coupling of the insulative mounting member to the battery cell.

In accordance with another aspect of the present invention, there is provided a protection circuit module (PCM) including a protection circuit for controlling overcharge, overdischarge, and overcurrent of a battery cell, wherein the PCM is provided with a safety device of which a circuit is cut off when temperature is high or a large amount of current flows, thereby interrupting the flow of current in a PCM circuit when temperature is high or a large amount of current flows.

In the PCM with the above-stated construction, the safety device is directly attached to the PCM, or the conductive pattern is formed at the region where the protection circuit is connected, with the result that it is not necessary to use an additional connection member for achieving the coupling between the PCM and the safety device and perform a welding process. Consequently, it is possible to improve process efficiency, to considerably increase the volume density of the battery pack and, to efficiently improve the safety of the battery cell.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Figure 1:
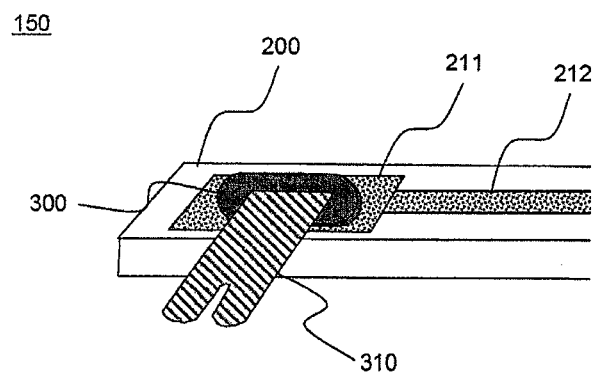
FIG. 1 is a perspective view illustrating a protection circuit module (PCM) configured to be mounted to a battery cell according to an embodiment of the present invention.

FIG. 1 is a perspective view typically illustrating a protection circuit module (PCM) configured to be mounted to a battery cell according to an embodiment of the present invention.

Referring to FIG. 1, the PCM 150 includes a protection circuit board (PCB) 200, a protection circuit 212 printed on the bottom of the PCB 200, a positive temperature coefficient (PTC) element 300 of which the top is attached to an end 211 of the protection circuit 212, and a connection member 310 attached to the bottom of the PTC element 300.

The PCB 200 is constructed in a structure in which the protection circuit 212, which controls overcharge, overdischarge, and overcurrent of the battery cell and achieves the electrical connection between the battery cell and an external input and output terminal, is printed on a rectangular parallelepiped structure made of epoxy composite. The top of the PTC element 300 is directly attached to the one end 211 of the protection circuit 212 electrically connected to the external input and output terminal, among the circuits printed on the PCB 200, by soldering.

No additional connection member is used to achieve the electrical connection between the PTC element 300 and the PCM 150. Consequently, it is possible to reduce the internal space of the battery cell, to increase the size of the battery cell as compared with other battery cells having the same standard, and to omit a welding process, thereby improving process efficiency.

Meanwhile, the connection member 310 is attached to the bottom of the PTC element 300 by soldering. The connection member 310 is coupled to a corresponding electrode terminal of the battery cell (not shown) by welding or soldering to achieve the electrical connection between the battery cell and the PTC element 300.

In this structure, electric current flows from the battery cell to the protection circuit 212 on the PCB 200 via the PTC element 300 by the connection member 310. Consequently, when the battery cell overheats, with the result that the temperature of the battery cell abruptly increases, for example, the PTC element 300 interrupts the introduction of the electric current to the protection circuit 212 to secure the safety of the battery cell.

Figure 2:
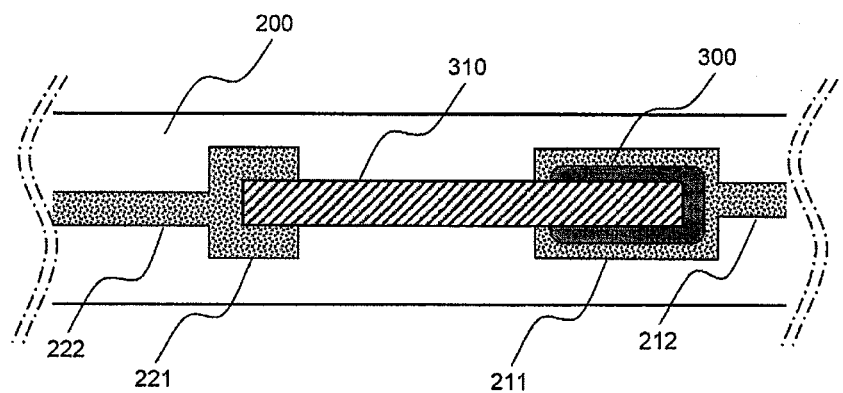
FIG. 2 is a plan view illustrating a PCM configured to be mounted to a battery cell according to another embodiment of the present invention.

FIG. 2 is a plan view illustrating a PCM configured to be mounted to a battery cell according to another embodiment of the present invention.

Referring to FIG. 2, the PTC element 300 is directly coupled to one end 211 of the protection circuit 212, which is electrically connected to the external input and output terminal, in the same manner as in FIG. 1. The connection member 310 is attached to the bottom of the PTC element 300. Also, the connection member 310 is coupled to one end 221 of another circuit on the PCB 200, i.e., an operation circuit 222 necessary to operate a battery pack.

In this structure, for example, electric current flows from the battery cell to the operation circuit 222 on the PCB 200 and then flows to the protection circuit 212 connected to the external input and output terminal via the PTC element 300 by the connection member 310. Consequently, when the internal temperature of the battery cell increases, the PTC element 300 interrupts the introduction of the electric current to the protection circuit 212 to secure the safety of the battery cell.

Figure 3:
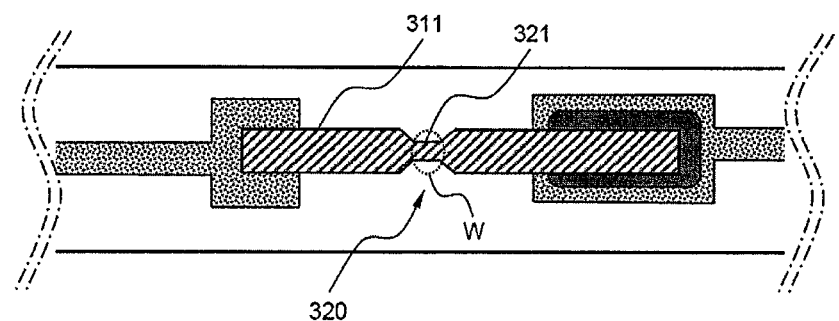
FIG. 3 is a plan view illustrating a PCM configured to be mounted to a battery cell according to another embodiment of the present invention.

FIG. 3 is a plan view illustrating a PCM configured to be mounted to a battery cell according to another embodiment of the present invention. The PCM of FIG. 3 is identical to that of FIG. 2 except the shape of a connection member attached to the PTC element. Therefore, a detailed description of other components excluding the connection member will not be given.

Referring to FIG. 3, the connection member 311, attached to the top of the PTC element 300, has an overcurrent interruption part 320, which is partially provided at opposite sides thereof with depressions 321. Due to the depressions 321, the overcurrent interruption part 320 has a width less than that of the other region of the connection member 311. In consideration of a fact that a resistance value R is in inverse proportion to the sectional area, as previously described, the overcurrent interruption part 320 has a resistance value higher than that of the other region of the connection member 311 on the assumption that the connection member 311 has the same thickness. Consequently, when overcurrent is generated, and therefore, the battery cell is in an abnormal operation state, the amount of heat generated from the overcurrent interruption part 320 increases, with the result that the overcurrent interruption part 320 is easily cut off. In particular, there is a great possibility that a narrow width region W will be cut off when overcurrent is generated.

The connection member 311 with the above-stated construction is not only electrically connected to the battery cell or the circuit formed on the PCM but also performs to interrupt the flow of electric current therethrough by cutting itself off when overcurrent is generated. Consequently, there is no necessity to mount an additional protection element for overcurrent interruption, and therefore, it is possible to reduce the number of parts of the battery pack and to easily achieve the assembling process, thereby improving productivity.

Meanwhile, although the depressions 321 of the overcurrent interruption part 320 are formed at the opposite sides of the connection member 311 as shown in the drawing, a depression 321 may be formed at only one side of the connection member 311. Also, the depressions 321 may be formed in a notch shape or in a square shape although the depressions 321 are formed in a round shape.

Figure 4:
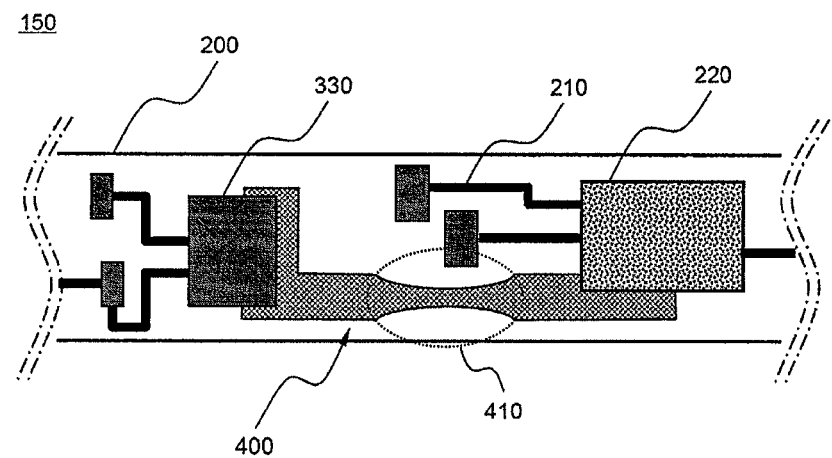
FIG. 4 is a plan view illustrating a PCM configured to be mounted to a battery cell according to a further embodiment of the present invention.

FIG. 4 is a plan view illustrating a PCM configured to be mounted to a battery cell according to a further embodiment of the present invention.

Referring to FIG. 4, the PCM 150 includes a PCB 200, a protection circuit 210 printed on the PCB 200, various elements 330 such as a field effect transistor (FET), a voltage detector, a resistor, and a condenser, and a conductive pattern 400 having a fusing part 410.

At the PCB 200 is formed a terminal connection part 220 configured to be coupled to a corresponding electrode terminal of the battery cell (not shown). The terminal connection part 220 may be directly coupled to the electrode terminal. Alternatively, the terminal connection part 220 may be coupled to the electrode terminal via an additional conductive connection member (not shown), such as a nickel plate.

The protection circuit 210, printed on the PCB 200, is electrically connected to an external input and output terminal (not shown) and the terminal connection part 220.

The conductive pattern 400 is printed on the PCB 200 as a part of the protection circuit 210. Consequently, when overcurrent is generated, the flow of electric current in the protection circuit 210 is interrupted, thereby interrupting the electrical conduction between the external input and output terminal and the battery cell. In the drawing, the conductive pattern 400 is shown as a circuit of which one end is directly connected to the terminal connection part 220. Of course, however, the conductive pattern 400 may be formed at an arbitrary region of the circuit where the external input and output terminal and the terminal connection part 220 are connected to each other.

The fusing part 410 is formed at a predetermined position of the conductive pattern 400. The fusing part 410 has a width less than the overall width of the conductive pattern 400. In this structure, the fusing part 410 has relatively low current density and relatively high resistance. When a large amount of electric current is conducted, therefore, the amount of heat generated from the fusing part 410 is large. Consequently, when a large amount of electric current is conducted, the fusing part 410 fuses itself by the generated heat to interrupt the flow of the electric current, thereby securing the safety of the battery cell. Meanwhile, the conductive pattern 400 may be made of gold (Au) exhibiting high conductivity. Alternatively, the conductive pattern 400 may be made of a metal material, such as tin, having a high specific resistance value. Also, the fusing part may be formed in the shape of a notch, a rectangle, or a circle. Furthermore, two or more fusing parts may be used according to circumstances.

Figure 5:
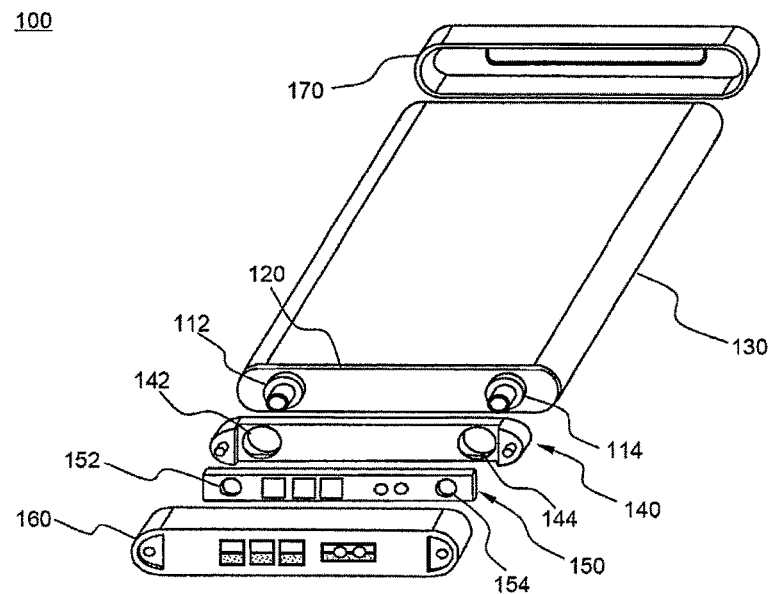
FIG. 5 is an exploded perspective view illustrating a battery pack according to an embodiment of the present invention.

FIG. 5 is an exploded perspective view typically illustrating a battery pack 100 according to an embodiment of the present invention.

Referring to FIG. 5, the secondary battery pack 100 according to this embodiment includes a battery cell 130 having an electrode assembly received in a battery case together with an electrolyte, a top cap 120 for sealing the top, which is open, of the battery case, a plate-shaped protection circuit module 150 having a protection circuit formed thereon, an insulative mounting member 140 mounted to the top cap 120 of the battery cell 130, an insulative cap 160 coupled to the upper end of the battery cell 130 for covering the insulative mounting member 140 in a state in which the protection circuit module 150 is loaded on the insulative mounting member 140, and a bottom cap 170 mounted to the lower end of the battery cell 130.

A pair of protrusion-type electrode terminals 112 and 114, i.e., a first protrusion-type electrode terminal 112 and a second protrusion-type electrode terminal 114, protrude upward from opposite sides of the upper end of the top cap 120. The insulative mounting member 140 is provided with through-holes 142 and 144 having a shape and size corresponding to the lower ends of the protrusion-type electrode terminals 112 and 114. The protection circuit module 150 is provided with through-holes 152 and 154 having a shape and size corresponding to the upper ends of the protrusion-type electrode terminals 112 and 114.

The first protrusion-type electrode terminal 112 is connected to a cathode (not shown) of the battery cell 130 while being electrically connected to the top cap 120. The second protrusion-type electrode terminal 114 is connected to an anode (not shown) of the battery cell 130 while being electrically isolated from the top cap 120.

The coupling of the insulative mounting member 140 and the protection circuit module 150 to the battery cell 130 is achieved by inserting the protrusion-type electrode terminals 112 and 114 through the through-holes 142 and 144, located at the opposite sides of the insulative mounting member 140, and the through-holes 152 and 154, located at the opposite sides of the protection circuit module 150, and pressing the ends of the protrusion-type electrode terminals 112 and 114. Also, the coupling of the insulative mounting member 140 to the top cap 120 may be achieved by an adhesive.

The insulative cap 160 is coupled to the upper end of the battery cell 130 for covering the insulative mounting member 140 in a state in which the protection circuit module 150 is loaded on the insulative mounting member 140. The insulative cap 160 extends downward by a predetermined length to cover the outside of the upper part of the battery cell 130. The bottom cap 170 is mounted to the lower end of the battery cell 150.

In the battery pack 100 with the above-stated construction, the top of a PTC element (not show) is attached to the bottom of the protection circuit module 150, and the bottom of the PTC element is directly coupled to the protrusion-type electrode terminals 112 and 114 via a connection member coupled to the bottom of the PTC element such that the PTC element is electrically connected to the protrusion-type electrode terminals 112 and 114, as in FIGS. 1 to 3.

Figure 6:
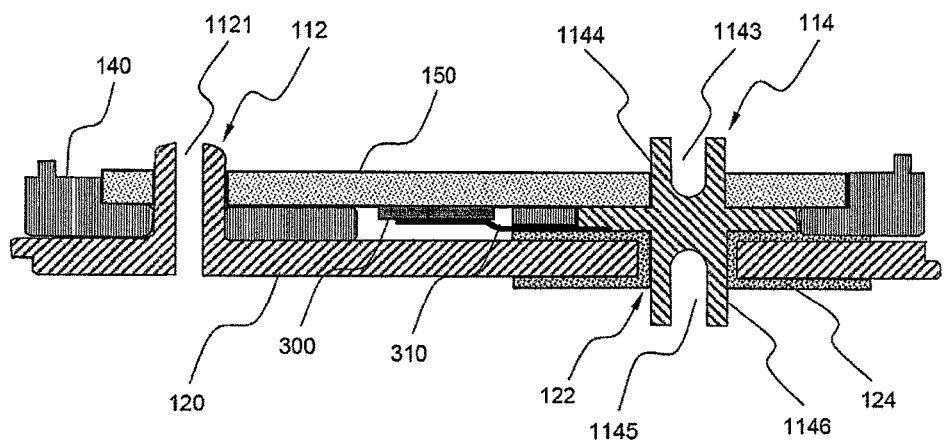
FIG. 6 is a vertical sectional view illustrating the upper part of the battery pack shown in FIG. 5.

The upper part of the battery pack constructed in a structure in which the PTC element is directly coupled to the electrode terminals via the connection member is illustrated in FIG. 6 as a vertical sectional view.

Referring to FIG. 6 together with FIG. 5, the insulative mounting member 140 and the protection circuit module 150 are sequentially mounted to the top cap 120, which is integrally formed with the first protrusion-type electrode terminal 112, at the top of the battery pack 100.

A through-channel 1121, through which an electrolyte is injected, is formed at the central region of the first protrusion-type electrode terminal 112. Also, the first protrusion-type electrode terminal 112 is integrally formed with the top cap 120. On the other hand, the second protrusion-type electrode terminal 114 has a lower extension 1146 inserted through the through-hole 122 of the top cap 120 from above. At the interface between the second protrusion-type electrode terminal 114 and the top cap 120 is mounted an electrically insulative gasket 124 for achieving the insulation between the second protrusion-type electrode terminal 114 and the top cap 120. Also, depression grooves 1143 and 1145 are formed at ends of an upper extension 1144 and a lower extension 1146 of the second protrusion-type electrode terminal 114.

The PTC element 300 is directly attached to the bottom of the protection circuit module 150. The connection member 310, attached to the bottom of the PTC element 300, is connected to the second protrusion-type electrode terminal 114. The coupling between the connection member 310 and the second protrusion-type electrode terminal 114 may be achieved by welding. However, it is possible to stably achieve the electrical connection between the connection member 310 and the second protrusion-type electrode terminal 114 even in a state in which the connection member 310 is simply inserted between the gasket 124 and the second protrusion-type electrode terminal 114 such that the connection member 310 is in tight contact with the gasket 124 and the second protrusion-type electrode terminal 114.

In the battery pack 100 with the above-stated construction, on the other hand, the PCM 1560 may be directly electrically connected to the electrode terminal without using an additional connection member. Also, since a conductive pattern (not shown) for interrupting the flow of electric current when overcurrent is generated is printed at the bottom of PCM 150 as a part of the protection circuit, as shown in FIG. 4, it is not necessary to mount an safety element, having a predetermined volume, for overcurrent interruption. That is, the battery pack 100 according to the present invention does not require a space for electrical connection and mounting of the safety element. Consequently, it is possible to construct the battery pack in a very compact structure and to increase the volume density of the battery pack.

INDUSTRIAL APPLICABILITY

As apparent from the above description, the battery pack according to the present invention is constructed in a structure in which the PCM is provided with the safety device of which the circuit is cut off when temperature is high or a large amount of electric current flows. Consequently, it is possible to increase the volume density of the battery pack and, at the same time, to efficiently improve the safety of the battery pack.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A battery pack comprising:
a battery cell having an electrode assembly of a cathode/separator/anode structure mounted in a battery case together with an electrolyte in a sealed state; and
a protection circuit module electrically connected to the battery cell,
wherein the protection circuit module includes a protection circuit board electrically connected to the battery cell, the protection circuit board including:
a protection circuit printed on the protection circuit board and electrically connected to the battery cell, the protection circuit including:
a conductive pattern on a bottom surface of the protection circuit board as a part of the protection circuit and electrically connected to the battery cell,
a connection member having a first end connected to an end of the conductive pattern, the connection member having a first width,
a fusing part in the conductive pattern, the fusing part having a width of 10-90% of the first width of the connection member,
wherein the fusing part is configured to fuse itself to interrupt the flow of current when a predetermined amount of current is conducted through the conductive pattern, and
wherein the fusing part has electrical resistance due to current density.

2. The battery pack according to claim 1, wherein the conductive pattern is made of gold, printed on the protection circuit board.

3. The battery pack according to claim 1, wherein the fusing part is formed of a metal material exhibiting predetermined specific resistance.

4. The battery pack according to claim 1, wherein the conductive pattern is formed of a metal material exhibiting specific resistance greater than that of a protection circuit pattern printed on the protection circuit board.

5. The battery pack according to claim 3, wherein the metal material exhibiting specific resistance is tin or a tin alloy.

6. The battery pack according to claim 4, wherein the metal material exhibiting specific resistance is tin or a tin alloy.

7. The battery pack according to claim 1, wherein one or both side edges of the connection member extend toward a middle of the connection member to form the fusing part.

8. The battery pack according to claim 1, further comprising a positive temperature coefficient (PTC) element connected to a bottom surface of the conductive pattern, and
wherein the connection member is connected to a bottom surface of the PTC element so that the PTC element is between the conductive pattern and connection member.

9. The battery pack according to claim 1, further comprising an operation circuit on the bottom surface of the protection circuit board,
wherein the connection member has a second end connected to the operation circuit.

* * * * *